(12) United States Patent
Walko, II (10) Patent No.: US 6,221,202 B1
(45) Date of Patent: *Apr. 24, 2001

(54) EFFICIENT PLASMA CONTAINMENT STRUCTURE

(75) Inventor: Joseph Philip Walko, II, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/283,959

(22) Filed: Apr. 1, 1999

(51) Int. Cl.[7] .................................................. H05H 1/00
(52) U.S. Cl. ................... 156/345; 118/723 E; 118/723 R
(58) Field of Search ..................... 156/345; 118/723 R, 118/723 E (56) References Cited

U.S. PATENT DOCUMENTS

| 4,384,938 | 5/1983 | Desilets et al. ................ 204/298 |
| 4,717,448 | 1/1988 | Cox et al. ..................... 156/643 |
| 5,074,985 | 12/1991 | Tamura et al. ............... 204/298.11 |
| 5,210,466 | 5/1993 | Collins et al. ................ 315/111.21 |
| 5,221,425 | 6/1993 | Blanchard et al. ............... 156/643 |
| 5,498,313 | 3/1996 | Bailey et al. ................. 156/643.1 |
| 5,534,751 | 7/1996 | Lenz et al. .................. 315/111.71 |
| 5,605,637 | 2/1997 | Shan et al. ...................... 216/71 |
| 5,639,334 | 6/1997 | Camale et al. .................... 156/345 |
| 6,027,606 * | 2/2000 | Mohn et al. ..................... 156/345 |
| 6,051,100 * | 4/2000 | Walko, II ........................ 156/345 |

FOREIGN PATENT DOCUMENTS

| 7245295 | 9/1995 | (JP) . |
| 11040398 | 2/1999 | (JP) ..................... H05H/1/46 |

* cited by examiner

Primary Examiner—Thi Dang
(74) Attorney, Agent, or Firm—Robert A. Walsh (57) ABSTRACT

Plasma containment is achieved within a region by a containment plate while gas is allowed to flow through this region by openings in the plate. The openings in the plate are larger in two of the cross-sectional dimensions parallel to the plate surface than the thickness of the dark space or plasma sheath. The openings of the plate are wider nearest the source of the electromagnetic energy in order to attenuate the electromagnetic fields and thereby prevent build up of deposits which would block the flow gas through the plate.

32 Claims, 3 Drawing Sheets

EFFICIENT PLASMA CONTAINMENT STRUCTURE

BACKGROUND OF THE INVENTION

1. Field of the Invention

The present invention relates to a structure utilized to contain a plasma and/or electromagnetic field within a desired space while maintaining high conductance across the structure.

2. Description of Related Art

Plasma processing is often used under circumstances where it is beneficial to restrict the presence of the plasma to a certain region in the chamber while maintaining the ability to flow gasses through the plasma containing region. Several methods of plasma containment are currently in practice, including magnetic confinement, inertial confinement and confinement by solid or nearly solid barriers. Inertial confinement works only for short periods of time and has been shown useful only in power generating and explosive devices. Magnetic confinement has strong limitations in its application to many industrial applications. Because of the shortcomings of inertial and magnetic confinement systems, industrial plasma confinement is most often achieved by using a physical barrier within the chamber to confine the plasma.

For systems confining the plasma by physical barriers, this has been accomplished by placing openings in the physical barrier for the gases to flow through. Plasma confinement has been maintained by making at least one dimension of the cross section of these openings similar in size or smaller than the plasma sheath or dark space as disclosed in U.S. Pat. Nos. 4,384,938 and 5,605,637. However, utilizing such small holes in the physical barrier has been found to lead to low conductance, particularly when the molecular mean free path is similar to or longer than the dark space. Further, these small holes tend to clog in the presence of a depositing chemistry such as is typically used in selective etching. This clogging not only restricts the useful time between cleaning of the chamber but creates continually changing process conditions which can reduce process yields.

In the case of highly selective etch chambers utilized in the semiconductor manufacturing industry, it is common to have plasma conditions where the molecular mean free path is long compared to the dark space of the RIE chamber and where there is the problem of film deposited on the physical barrier. Accordingly, there is a long-felt need for plasma barriers in RIE systems that have a high, relatively stable conductance and excellent plasma confinement properties even when the molecular mean free path is long compared to the dark space and/or when a film is being deposited on the barrier.

Bearing in mind the problems and deficiencies of the prior art, it is therefore an object of the present invention to provide a barrier useful in systems that has a high, relatively stable conductance.

It is another object of the present invention to provide a barrier useful in systems that has excellent plasma confinement properties even when the molecular mean free path is long compared to the dark space.

A further object of the invention is to provide a barrier useful in systems that has excellent plasma confinement properties even when a film is being deposited on the barrier.

It is yet another object of the present invention to provide a system that incorporates a barrier having the aforementioned advantages.

SUMMARY OF THE INVENTION

The above and other objects and advantages, which will be apparent to one of skill in the art, are achieved in the present invention which is directed to, in a first aspect, a containment structure for a plasma which includes means for containing a plasma, that is sustained by an electromagnetic field, within a desired space by attenuating the electromagnetic field outside of the space to levels which do not sustain the plasma while maintaining high conductance across the containment structure; and which further includes means for permitting gas flow through the containment structure even though contaminants build up on the containment structure. Details of operations of a similar device may be found in a co-pending patent application Ser. No. 08/957,412 filed on Oct. 24, 1997 now U.S Pat. No. 6,051,100 which is assigned to the same assignee as this case and is hereby included herein by reference.

In a related aspect, the present invention provides a plasma reactor containing a reactor chamber adapted to create and sustain a plasma in a space therein, along with a containment structure. The containment structure includes means for containing a plasma within a desired portion of space in the chamber by attenuating an electromagnetic field generated in the chamber while maintaining high conductance across the containment structure; and means for permitting gas flow within the chamber and through the containment structure while allowing significant deposit to accumulate before the structure's conductance is appreciably changed.

The plasma has a plasma sheath and two dimensions of the openings along a surface of the containment structure are greater than the plasma sheath. The structure is electrically conductive and comprises a lower and upper portion. The portions may be separated into two separate and distinct units or combined into a single unit. The upper portion closest to the electromagnetic energy has widely spaced openings which attenuates the energy of surrounding plasma. The wider spaced openings permit deposits to accumulate without severely affecting the conductance of the gas which passes through both the upper and lower portions. The lower portion which is farther away from the electromagnetic energy has narrowly spaced openings in which the plasma density is lowered sufficiently to where it is no longer sustained.

In another aspect, the present invention provides a plasma reactor comprising a reactor chamber adapted to create and sustain an active plasma in a space therein and a plasma containment structure while avoiding build up of contaminants which would block the flow of gases through the smaller openings of the lower portion of the containment structure. The plasma containment structure includes means for containing an active plasma within a desired portion of space in the chamber on one side of the structure by attenuating an electromagnetic field in the chamber while maintaining high conductance across the containment structure. The containment structure may permit formation of a cold plasma on the other side of the structure. The containment structure also includes means for permitting gas flow within the chamber and through the containment structure.

All three dimensions of the openings may be greater than the molecular mean free path of the plasma, and may be greater than the plasma sheath. As previously indicated, the structure may comprise spaced, wide and narrow openings having conductive surfaces and the conductive surfaces may form the openings for the gas flow.

In yet another aspect, the present invention relates to a plasma reactor comprising a reactor chamber adapted to create and sustain a plasma in a space containing an electromagnetic field and a containment structure in the chamber. The containment structure is made of an electrically conductive material and is configured to contain a plasma within a desired space in the chamber by attenuating an electromagnetic field in the chamber while maintaining high conductance across the structure. The structure contains openings for permitting gas flow within the chamber, the openings having the two dimensions parallel to a surface of the containment structure greater than the plasma sheath. The structure may comprise a plurality of containment plates adapted to progressively attenuate the plasma and electric field while reducing the build up of contaminants which would block the flow of gases and change the conductance of the structure. The structure may comprise spaced, wide and narrow slits, holes or openings in the conductive surfaces, and the spaces between the surfaces may comprise the openings for the gas flow.

It is also preferred that the structure contain conductive surfaces oriented to prevent line of sight transmission of a vector in the direction of the electric field at the opening to attenuate an electromagnetic field. The openings have a width and a depth, and the ratio of the width to depth of the openings may vary across the structure as a function of strength of the electromagnetic field.

In another aspect, the present invention relates to a containment structure for a chamber containing an electromagnetic field. The containment structure comprises a structure made of an electrically conductive material configured to contain an electromagnetic field within a desired space in the chamber by attenuating the field generated in the chamber while maintaining high conductance across the structure. The structure contains wide and narrow openings having surrounding conductive surfaces there through for reducing the build up of deposits while permitting gas flow within the chamber, the openings having a width and a length such that the ratio of the width to length of the openings is sufficient to attenuate the electromagnetic field, the surfaces being oriented in a direction less than or substantially equal to 90° from the direction of the electromagnetic field at the opening.

In a related aspect, the present invention provides a chamber containing an electromagnetic field and including a containment structure. The containment structure comprises a plate made of an electrically conductive material configured to contain an electromagnetic field within a desired space in the chamber by attenuating the field generated in the chamber while maintaining high conductance across the plate. The plate contains wide openings in the upper portion and narrow openings in the lower portion and both having surrounding conductive surfaces there through for permitting gas flow within the chamber. The upper openings have a width and a length such that the ratio of the width to length of the openings is sufficient to attenuate the electromagnetic field significantly but not strongly enough to completely contain the plasma before it reaches the more narrowly spaced surfaces of the lower portion, the surfaces being oriented in a direction less than or substantially equal to 90° from the direction of the electromagnetic field at the opening.

The reactor chamber described above may contain an anode and a cathode, and the plasma reactor of the present invention is particularly suitable for reactive ion etching.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–5 of the drawings in which like numerals refer to like features of the invention. Features of the invention are not necessarily shown to scale in the drawings.

Figure 3:
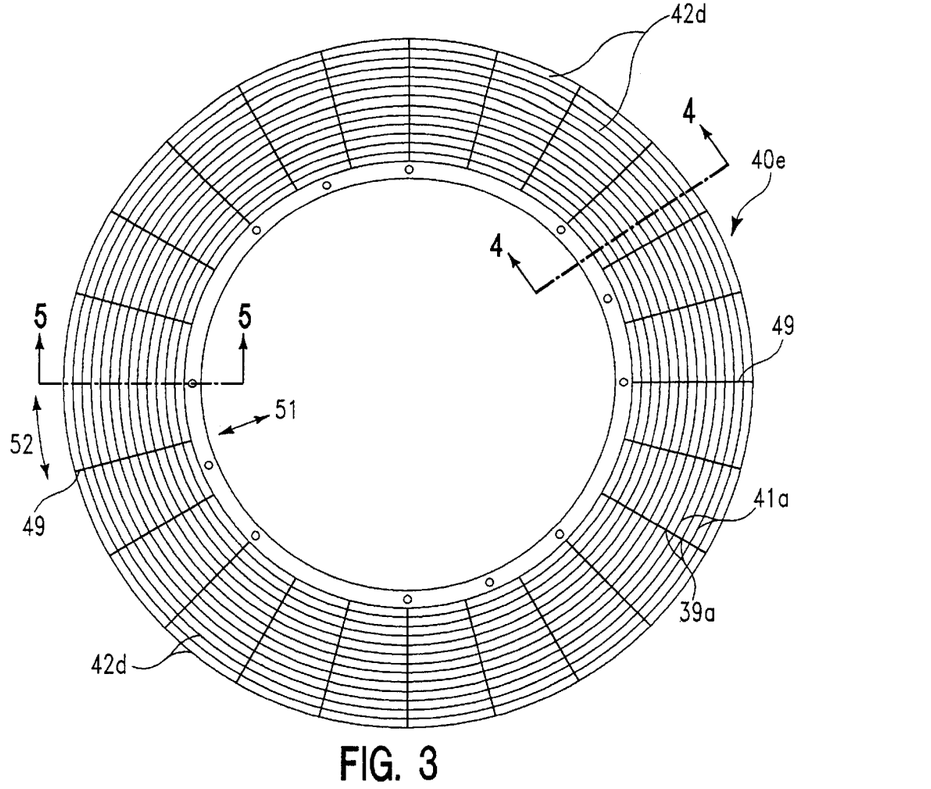
FIG. 3 is a bottom (facing the weaker electromagnetic field) plan view of a second embodiment of the containment plate constructed in accordance with the present invention.
Figure 4:
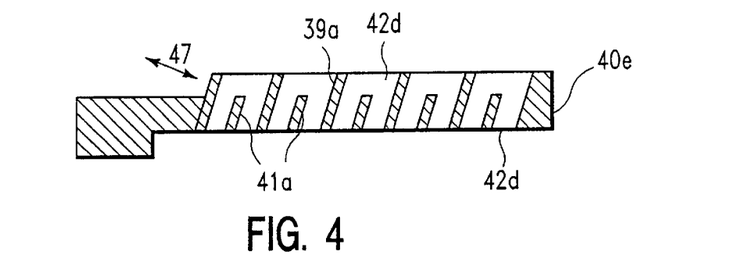
FIG. 4 is a vertical sectional view of the containment plate along line 4—4 of FIG. 3 showing the alternating ring size.
Figure 5:
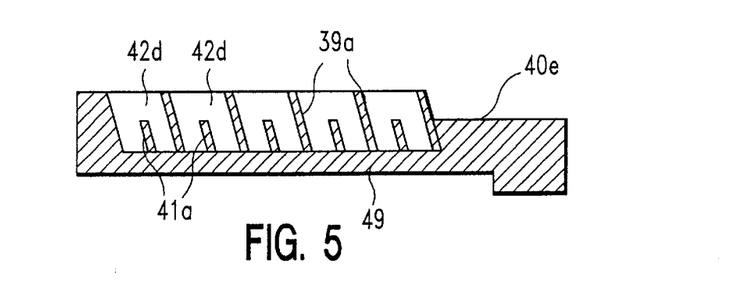
FIG. 5 is a vertical sectional view of the containment plate along line 5—5 of FIG. 3 showing the openings and supporting strut.

The present invention is useful for various plasma reactors which generate and contain an active plasma for depositing layers of materials, such as polymeric films, or for etching, or a combination of film deposition and etching or surface modification, etc. In the preferred embodiment, the present invention is used in reactive ion etching chambers for processing semiconductor wafers. In accordance with the teachings of this invention a barrier such as a plate is placed along the desired boundary between the plasma region and the remainder of plasma reactor chamber, such as a RIE chamber region, to be free of plasma to contain the plasma. This containment boundary may be flat or curved as desired in accordance with the present invention. This containment structure or barrier (also described herein as a plate of plates) may be made of a conductive material that is capable of obtaining sufficient surface charge as to eliminate electric fields from its interior. For applications where conductance or film deposition on the plate is a particular concern, multiple plates may be used, with the plate closer to the plasma partially attenuating the electromagnetic fields and associated plasma and those further away finishing the job. Such that the upper plate may use larger holes or openings that have higher conductance and are less susceptible to clogging due to deposits. These plates may be separate or continuous as shown in FIGS. 3–5. While the use of multiple plates has advantages, it is believed that they may be not required in most circumstances, and that a single containment plate made in accordance with the present invention will be adequate as described below.

For most applications using high energy radio frequencies (RF) sources, it is preferred that the plate be electrically connected to the RF circuit, normally to the ground. When high frequency sources such as microwave are utilized, it may be possible to allow the plate to electrically float. The crossover between these two domains is roughly when the width of the surface of the plate becomes large compared to the wavelength of the electromagnetic fields that are providing power to sustain the plasma. When the width of the plate is large compared to the wavelength of the electromagnetic fields that are sustaining the plasma, they behave like photons that may be absorbed or reflected without the need for a net change in the charge on the plate as a whole.

The containment plate of this invention also contains openings to allow the passage of gas molecules through it. These openings are made as large, short and as numerous as possible, given that the plate should have sufficient supporting strength and the plasma must be contained. However, during operation deposits of material such as polymers carried by the gases tend to build up on the surfaces of the upper portion of the containment plate. Such build up causes the plate to lose its efficiency and eventually have to be shut down.

To optimize these criteria, the walls of the openings are angled to cause the electromagnetic field that sustains the plasma to fall off rapidly within the openings and become too weak to sustain a plasma before it reaches the other side of the containment plate(s). While it has been found that any opening that has a cross-section narrow compared to the wavelength of the electromagnetic field will attenuate the electromagnetic fields if made long enough, the conductance for such an opening may be very low. It is desired to attenuate the fields within the plate while maintaining high conductance. It has been found that to accomplish this, the angle between the incident radiation (the direction of the electric field for radio frequencies or Poynting vector for microwave frequencies, as will be discussed further below) and the wall of the openings should be less than or approximately equal to 90 degrees. An angle substantially less than 90 degrees generally results in faster falloff of the fields, but an angle approximately 90 degrees often yields better conductance while maintaining excellent plasma containment. This will be discussed in more detail below in connection with FIG. 3.

For systems where the wavelength of the electromagnetic fields is very long with respect to the chamber dimensions, the angle of the conductive surfaces is determined with respect to the electrical field direction. This allows for attenuating the electric fields with quasi-static surface charges. It should be noted that while all electric fields are perpendicular to the surface of a perfect conductor, regardless of its angle, the electric field direction considered herein is the electric field direction at the containment plate(s) opening, after accounting for the distorting effects of the plate itself on the electric field.

For systems where the wavelength of the electromagnetic fields is very short with respect to the chamber dimensions, the conductive surface angle is determined with respect to the direction of the Poynting vector. This allows the openings to prevent line of sight transmission of the Poynting vector through the plate, similar to closed venetian blinds keeping out light. In the case of short wavelength, the conductor should be of sufficient thickness to expel all electrical fields from within the plate interior to avoid the oscillating surface charge from acting as a source of additional electromagnetic radiation on the other side of the conductive surface. For wavelengths comparable to the width of the surface of the plate, the analysis is more complex but the design rule remains the same, and the openings are made between conductive material and are shaped so as to cause rapid attenuation of the electromagnetic fields within the openings while avoiding the build up of contaminants which would block the flow of gases.

Since there is a preferred orientation for the conductive surfaces to most efficiently attenuate the fields and for applications where the plate will encircle the source of the electromagnetic fields, the preferred opening in the containment plate is annular. It is also advantageous to keep the width of the openings large compared to the molecular mean free path, and this may be facilitated by adjusting the angle of the opening.

Further, the efficiency of the operation of the containment plate is improved if the plate has an electromagnetic field weakening device placed immediately on the plasma side of the plate. This electromagnetic field weakening device weakens the electromagnetic field that sustains the plasma without being required to contain the plasma. This allows for a very low profile device that has a very high conductance that is only very weakly affected by depositions on its surfaces. By weakening the electromagnetic fields that sustain the plasma this device weakens the plasma at the surface of the plasma containment plate (of which it may be a part). This weaker plasma may be contained with a plate that has larger openings and is therefore less sensitive to depositions; the weaker plasma also has a lower deposition rate. These two properties give the plasma containment plate/ electromagnetic field weakening device the properties of allowing a far greater amount of deposition to accumulate before the plate's conductance is appreciably changed (the bulk of the deposition occurs on the relatively insensitive electromagnetic field weakening portion.

The openings through the containment plate preferably have an alternating ring design one shorter then the one next to it so that they have a wide and narrow opening from the top to bottom portions respectively, as shown in FIG. 3 (element 40e) discussed further below. While this invention will function with rounded inside corners, the conductance gain that this affords is generally offset by the loss of effective electromagnetic attenuation. If the plasma containment is more than sufficient and it is desired that the conductance be raised, it is preferred that the thickness of the plate be reduced, thus making the path through the opening that the gas molecules must travel down shorter, or the openings be widened.

The structure of the containment plate may be coated with an insulator, such as an anodized or ceramic coating. However, since the effective width for conductance is the space between the insulated surface and the effective width for electromagnetic attenuation is the space between the conductive surfaces, a very thick insulating coating is less desirable in terms of conductance versus electromagnetic attenuation.

It should also be noted that the containment structure of the present invention may permit a cold plasma to exist in the portion of the reactor chamber on the side of the plate opposite the active plasma. The term active plasma is used to denote the plasma which exists in an electromagnetic field sufficient to sustain the plasma. Since the structure of the present invention may permit flow of ions which are not neutralized, these ionized molecules may form a cold plasma on the side of the containment structure opposite the workpiece. As used herein, the term containment structure refers to both containment of an active plasma and/or containment of an electromagnetic field. Additionally, the structure may or may not contain the cold plasma.

Figure 1:
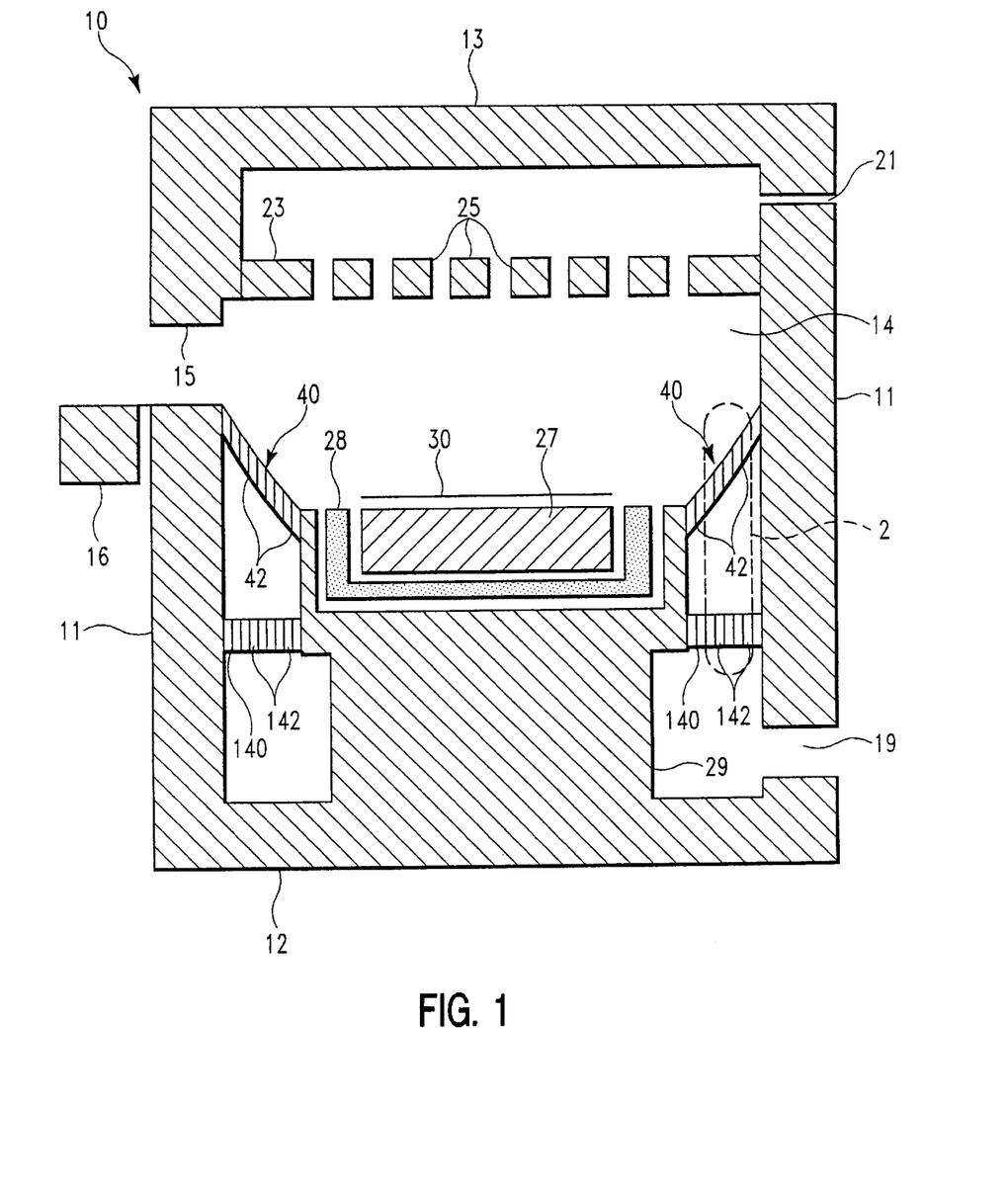
FIG. 1 is a vertical sectional view of a typical cylindrically symmetric reactive ion etch chamber utilizing one embodiment of the containment plate of the present invention.

FIG. 1 depicts one embodiment of the RIE system of the present invention, which is similar to a TEL Unity II available from Tokyo Electron Limited. The system includes a plasma reactor 10 which has a base plate 12, a cylindrical sidewall 11 and a top lid 13 surrounding a chamber 14. A processing or reactive gas input or inlet 21 permits gas to enter the chamber. A manifold 23 with a plurality of apertures 25 is centrally disposed with respect to cylindrical sidewall 11 (typically extending laterally about 150 mm) and is disposed between the sidewall 11 and the top lid 13 of the chamber. Chamber base plate 12, sidewall 11, top lid 13 and manifold 23 are preferably made of an electrically conductive material such as aluminum and are connected to electrical ground. A cathode 27, also preferably made of an electrically conductive material such as aluminum, is disposed on but electrically insulated from pedestal 29 and base plate 12, which preferably has an anodized surface. Cathode 27, supports an electrostatic chuck (not shown). A positive voltage is applied to the electrostatic chuck to firmly hold wafer 30 on the pedestal by appropriately charging the chuck. An insulator 28 or set of insulators surround the cathode on all sides but the top.

A wafer handler (not shown) carries the wafer 30 into and out of the chamber through a slit 15 located in the sidewall on the left side of the chamber. A hinged slit valve 16 is provided to close the chamber when the wafer handler is withdrawn. A wafer lift mechanism (not shown) is provided to transfer the wafer from the wafer handler to the electrostatic chuck prior to processing and from the electrostatic chuck to the wafer handler after the processing is completed. A quartz window for viewing the interior of the chamber may be provided in the chamber sidewall.

An RF system may be connected to the cathode to produce a plasma region between the wafer, plate, chamber sidewalls and the gas input manifold. A water cooling system may be provided for cooling the cathode and a helium cooling system may be provided for cooling the wafer.

The system described herein above is generally known and is of a standard type used in the semiconductor processing industry, and is also disclosed in U.S. Pat. No. 5,639,334, the disclosure of which is hereby incorporated by reference.

Alternately, the electromagnetic energy may be applied using microwave energy in which event the need for having an anode or cathode would no longer be required. The microwave energy could be introduced through a quartz window (not shown).

In accordance with the teachings of this invention, a containment structure includes plates 40 and 140. Top plate 40 is placed at the desired boundary between where the active plasma is desired and where no active plasma is desired. Containment structure 40 and 140 contains openings 42 and 42a respectively to permit process gasses to flow from the inlet 21, through the manifold 23, through the containment structure 40 and out pumping port 19. A pump (not shown) discharges the processing gas from pumping port 19 to a processing gas output.

The top containment structure 40 made according to the teachings of this invention preferably has a plate configuration and is designed to be incorporated in a semiconducting etch chamber similar to the one shown in FIG. 1, although it may be incorporated into other plasma reactors of other designs. This containment structure or plate has a large, relatively stable conductance and excellent confinement properties even when the molecular mean free path is long compared to the dark space and when a film is being deposited on the plate.

The containment plate is electrically conductive (e.g., anodized aluminum) and is electrically grounded and is used in a chamber that uses 13.56 MHz electromagnetic fields to sustain the plasma. A protective coating such as a thin ceramic may cover the plate to protect the plate. For the RIE chamber depicted herein, conductive rings form annular openings to attenuate the electromagnetic field, which rings may be held in place by supporting struts below the rings. These struts connect the conductive rings both mechanically and electrically and are placed below the rings to eliminate deposition on the struts which would reduce the conductance of the plate.

Plate 40 contains wide openings 42 to allow the passage of gas molecules through it. These openings are larger in two dimensions, i.e., the width and the length of the openings as seen in plan view (see FIG. 2, opening width in direction of radial arrow 51, opening length in direction of circumferential arrow 53) than both the plasma sheath and the molecular mean free path. They are as large, short (through the thickness of the structure) and as numerous as possible given the restraint that the plate must have sufficient mechanical strength and the plasma must be contained. Due to the very long wavelength of the 13.56 MHz fields with respect to the plate width, the walls of the openings may be angled such that they are approximately perpendicular to the electric field that sustains the plasma. This causes the electromagnetic fields to fall off very rapidly within the openings and become too weak to sustain a plasma before they reach the other side of the plate.

The openings at regions of high electromagnetic field strength (e.g., close to the cathode) need to have a large aspect ratio (the ratio of the width of the opening as seen in plan view to the depth dimension of the opening through the thickness of the plate) to attenuate the strong electromagnetic fields, those openings that have a weaker electromagnetic field to attenuate may use a smaller aspect ratio, and thereby have a larger conductance.

The containment structure of the present invention may include a lower containment plate, e.g., containment plate 140 containing narrow openings 142 in FIG. 1, adapted to progressively attenuate the plasma and electric field in the chamber.

Figure 2:
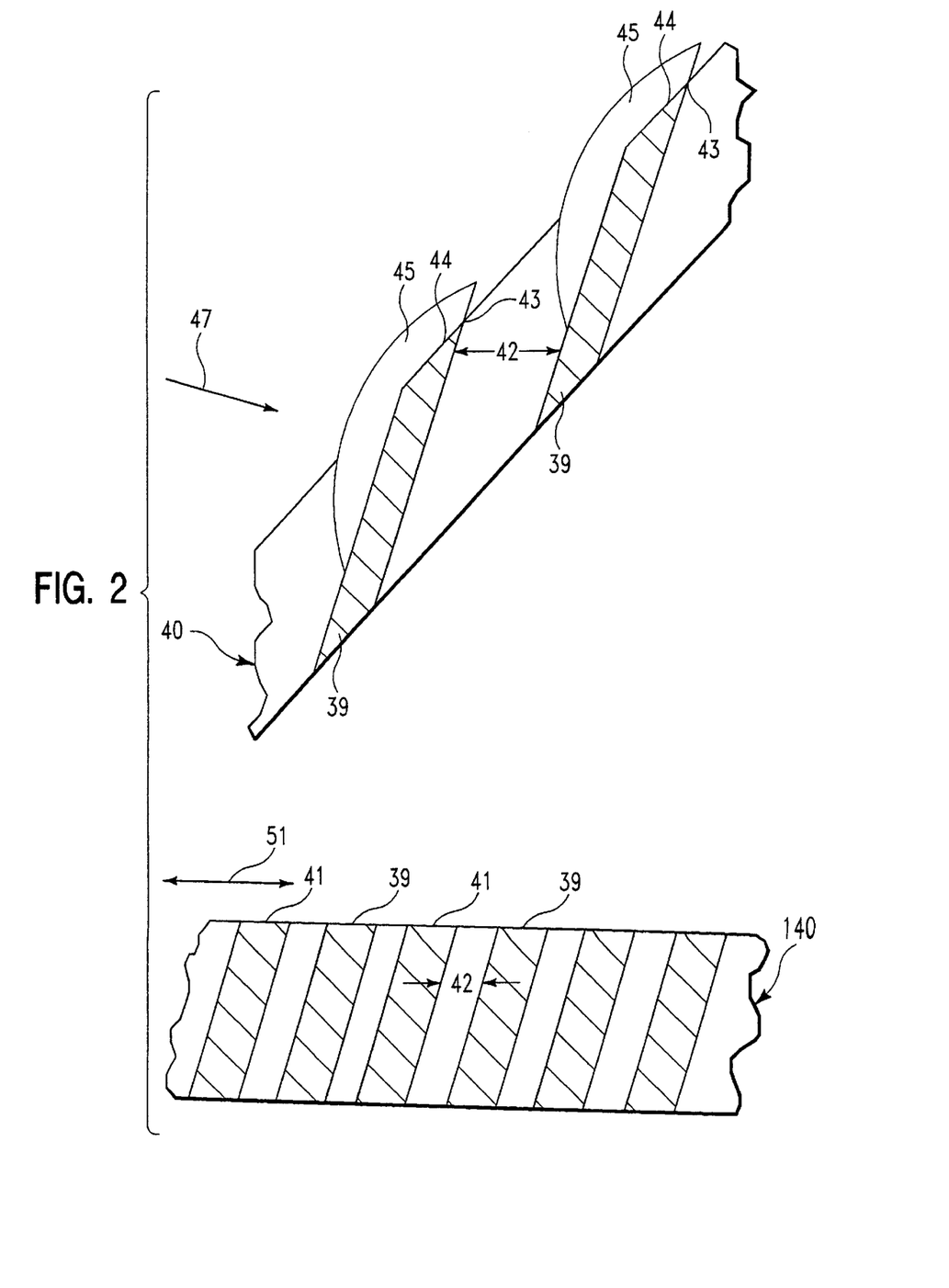
FIG. 2 is an expanded vertical sectional view, cut radially, of a portion of a containment plates 40 and 41 shown in FIG. 1, constructed in accordance with the present invention, having deposits on the upper plate surface facing the stronger electromagnetic field.

FIG. 2 depicts an elevational view of a radial section of a portion of containment plates 40 and 140 wherein the cathode is to the left of the section as shown. Note that an extra conducting ring 41 is spaced close to ring 39 to provide a narrow opening in the lower containment plate such that electromagnetic field is further weakened by the additional conducting ring 41 placed at a similar angle to ring 39. These rings of the upper plate 40 should be more widely spaced and interfere minimally with the conductance of the plate; this can be practically accomplished by having wider openings or by extending a fraction of the original plates further into the plasma containing area. These extensions form an electromagnetic field weakening aspect or attenuation of the plate. The height and spacing of the rings are optimized to control the electromagnetic field weakening aspect of the plate with that of the plasma containment in order to account for non-uniformities in effective plasma intensity. Deposits 45 are shown on the top surface of the ring 39 in the upper plate 40 facing the stronger electromagnetic field. These deposits accumulate mainly on the longest projection of ring 39 During operation these deposits build up and can block the flow of gas and disrupt the electric field being maintained by the containment plates. It has been found that this arrangement of ring design provides a great improvement in operation of the chamber. Since the containment plates do not require as much maintenance to remove the unwanted deposits, the chambers may be operated for longer intervals without being shut down to remove and clean the plates. The electric field direction in the vicinity of the plate 40 and openings 42 is shown by arrow 47. Openings 42 may be defined by uncoated, free conductive surfaces, or the conductive surfaces may be embedded in a dielectric material (e.g., a dielectric coating). Plate openings 42 have a sharp inside corners 43 on the upper surface 44 of the plate (facing the active plasma in the chamber) on the edge closest the cathode and workpiece. If and when deposits 45 form on the upper plate surface 44, this configuration will reduce the tendency of the deposits 45 to fill up or clog the openings 42. This configuration also maximizes conductance for a given amount of electromagnetic attenuation.

A second embodiment is illustrated in FIGS. 3–5 in which the function of the upper and lower containment plates described above are joined in a single containment plate. It is envisioned that the plates 40 and 140 shown in FIG. 1 and 2 may be replaced by a single plate 40e having an upper and lower portion.

FIG. 3 depicts a bottom plan view (the side away from the active plasma) of the containment plate 40e made in accordance with the present invention for use around a cathode and workpiece in a RIE chamber. Plate 40e may be made of aluminum with an anodized coating of about 50 microns thickness plate 40e has a thickness of about 6 mm and has a series of tall rings 39a and short rings 41a forming between adjacent ones annular openings 42d in the lower portion a width of 1.4 mm at an angle of 60° from horizontal and in the upper portion a width of 3.6 mm. As can now be realized, this configuration creates a wider spacing distance between ring 39a and wider openings in the upper portion of the plate nearest the source of electromagnetic energy. A narrower spacing distance between ring 39a and adjacent ring 41a is created in the lower portion. The difference in height between the tall rings 39a and short rings 41a provides a stepped structure which is analogous to the use of two plates as described above. In operation, the width is wider at the upper portion than in the lower portion. For structural integrity, a plurality of struts 49 are placed radially about the plate to secure the rings. As shown in elevational detail in FIG. 5, openings 42d do not pass completely through the plate 40e above strut 49. However, such openings 42d do pass completely through at portions away from the struts, in the manner shown in FIG. 4. Such openings have widths in direction of arrow 51 and lengths in direction of arrow 53 which are each greater than the plasma sheath within the portion of the chamber containing the active plasma.

In general, the conductive surfaces in the containment plate are preferably perpendicular to the local electric field that induces the plasma, and the width of the openings is about one-half the thickness of the plate. Typically, the openings have a width of about 1 to 50 mm, and the plates have a thickness of about 5 to 50 mm. The openings need not be small compared to the sheath distance to contain the plasma, since the plasma is contained by the rapid elimination of the electromagnetic field within the plate itself. Preferably, the opening width is at least 1–3 times the molecular mean free path of the plasma and 2–3 times the thickness of expected deposits on the plate.

The high conductance obtained through the containment plate made in accordance with the present invention is higher than can be obtained by prior art sheath confinement configurations, and such conductance levels tend to remain consistently higher throughout use of the plate. In one example in a TEL Unity II RIE chamber, gas flow was 1 std liter/min thru plate and pressure was maintained at 50 millitorr in chamber. Utilizing prior art sheath plates, the initial pressure drop across the plate was 20 millitorr. After a deposition of about 2 mm of film, the plate was completely clogged. When the containment plate of the present invention was utilized, as depicted in FIG. 5, the initial pressure drop was 5 millitorr, which indicated 4 times greater conductance. After a deposition of about 2 mm of film, a pressure drop of 18–19 millitorr was measured, and the plate was still functional.

Two principle techniques are available and may be used to design the containment plates. The first consists of using knowledge about the plasma to be contained and the deposition rate of the system to design a good electromagnetic field weakening device on the first try and the second does not require fore-knowledge of plasma properties, plasma physics or the deposition rate of the system to design an optimized plate. A combination of the two techniques also provides an excellent design as described below.

Using the first technique, consider placing the conductive surfaces as follows:

1. They should be as thin as possible while maintaining mechanical stability and while being capable of maintaining a zero electric field in their interior while in the presence of electromagnetic fields of the type using to maintain the plasma. To determine if the electric field will fall to zero in the interior, a skin depth calculation is performed.
2. The surfaces of the conductive plates are placed normal the electrical field as calculated in the absence of the electromagnetic field weakening device.
3. The conductive plates are electrically connected to ground.
4. The conductive plates have openings between them sufficient to allow a high gas conductance even after deposition occurs. The conductance of the plate may be calculated using the methods outlined in standard engineering texts.
5. The conductive plates have openings between them sufficient (normally sufficiently small) to significantly reduce the plasma density at the top of the plasma containment plate. Normally a 30–60% drop in plasma density is sufficient. The plasma density drop is calculated based on the properties of the initial plasma and the electrodynamics of the entire plasma chamber using methods as outlined in texts such as Classical Electrodynamics by J. D. Jackson.

While the first technique is certainly within the abilities of anyone skilled in the art of plasma engineering it may require time-consuming and expensive characterization of the system. In addition, persons unskilled in the art of plasma engineering may wish to design a good electromagnetic field weakening device for over their plasma containment plate. For these reasons a second technique may be used wherein the conductive surfaces are placed as follows:

1. They should be as thin as possible while maintaining mechanical stability and be made out of a good conductor such as aluminum, copper or silver, although almost any metal will do. Assume that if there is a thick enough surface for mechanical stability it will be capable of maintaining a zero electric field in their interior—a check to determine if the assumption is incorrect follows in the next steps.
2. Imagine your eye at the source of the electromagnetic fields looking toward the electromagnetic field weakening device—the surfaces of the conductive plates are placed normal to your line of sight.

3. Confirm that the conductive plates are electrically connected to ground.
4. Confirm that the the conductive plates have openings between them that are at least almost as wide as they are long (long being in the direction of gas flow) even after deposition occurs.
5. The conductive plates have openings between them not more than 2–3 times as large as the openings in the plasma containment plate.

Once such a plate is constructed, place it in the system for a period of time sufficient for an easily visible and measurable deposition to occur, then check to ensure the following:

A. The plates have deposition predominately only on one side—if not, the plates are either too thin (unlikely if using a good conductor) or not properly angled. This must be satisfied before continuing on to "B" or "C" or "D".

B. The part of the electromagnetic field weakening device that is facing the plasma should have significantly thicker deposits than the part of it close to the plasma containment plate. If not (but "A" is satisfied) items 4 & 5 are leaning too far toward good conductance at the expense of electromagnetic field weakening—make the plates taller or more closely placed. (Taller but more widely spaced plates are less likely to be affected by deposits but if the spacing is too wide the electrical conductance of the plasma itself dominates and no weakening occurs).

C. The gas flow conductance should not be strongly affected. If it is, reverse the advice given in "B".

D. If "A" is satisfied but "B" AND "C" are not, try changing the angle of the plates or reducing how tall and wide the openings are while keeping the same aspect ratio. In addition, insure good plate overlap as shown in FIG. 3.

The combination of both techniques may be used to produce the best design wherein much of the first technique is used as practical to get a first estimate then proceed with the second technique. Even when exhaustive characterization of the plasma and calculations are done the second approach is a very powerful tool.

While the present invention has been particularly described, in conjunction with a specific preferred embodiment, it is evident that many alternatives, modifications and variations will be apparent to those skilled in the art in light of the foregoing description.

It is therefore contemplated that the appended claims will embrace any such alternatives, modifications and variations as falling within the true scope and spirit of the present invention.

Thus, having described the invention, what is claimed is:

1. A containment structure having an upper and lower portion for a plasma comprising:
    means for containing a plasma, that is sustained by an electromagnetic energy, within a desired space by attenuating the electromagnetic field outside of said space to levels which do not sustain the plasma while maintaining high conductance across said containment structure having spaced, conductive surfaces; and
    means for permitting gas flow through said containment structure which includes openings through said structure and wherein said means for containing a plasma comprises conductive surfaces oriented in a direction less than or substantially equal to 90° from the direction of the electromagnetic field at said opening, while reducing the deposits from said plasma on parts of said containment structure.

2. The containment structure of claim 1 wherein said plasma has a plasma sheath and two dimensions of said openings along surface of said containment structure are greater than said plasma sheath.

3. The containment structure of claim 2 wherein said conductive surfaces form said openings.

4. The containment structure of claim 2 wherein said means for containing a plasma maintains high conductance in the presence of deposits from said plasma on said containment structure.

5. The containment structure of claim 4 wherein the electromagnetic energy is created by microwaves which propagates along a Poynting vector and the conductive surfaces are oriented less than or equal to 90 degrees from the Poynting vector.

6. The containment structure of claim 4 wherein the electromagnetic energy is created by high energy at radio frequencies having an electric field and the conductive surfaces are oriented less than 90 degrees from the electric field.

7. The containment structure of claim 3 wherein the openings in the upper portion are wider than the openings in the lower portion.

8. The structure of claim 3 wherein the openings are gradually reduced in size.

9. A plasma reactor comprising:
    a reactor chamber adapted to create and sustain a plasma in a space therein;
    a containment structure having an upper and lower portion for containing a plasma within a desired portion of space in said chamber by attenuating electromagnetic energy having an electric field in said chamber while maintaining high conductance across said containment structure; and
    means for permitting gas flow within said chamber and through said containment structure which includes openings through said structure which reduce the deposits from said plasma on said structure by lowering plasma intensity and wherein said means for containing a plasma comprises conductive surfaces oriented in a direction less than or substantially equal to 90° from the direction of the electric field at said opening.

10. The plasma reactor of claim 9 wherein said conductive surfaces form said openings.

11. The plasma reactor of claim 9 wherein said reactor chamber contains an anode and a cathode.

12. The plasma reactor of claim 9 wherein said reactor chamber comprises a reactive ion etching chamber.

13. The plasma reactor of claim 9 wherein said reactor chamber comprises a plasma enhanced chemical vapor deposition chamber.

14. The plasma reactor of claim 10 wherein the openings in the upper portion of the structure are wider than the openings in the lower portion of the structure.

15. A plasma reactor comprising:
    a reactor chamber adapted to create and sustain an active plasma in a space therein; and
    a plasma containment structure having an upper and lower portion comprising means for containing an active plasma within a desired volume of space in said chamber on one side of said structure by attenuating electromagnetic field and permitting passage of ionized molecules while maintaining high conductance across said containment structure, thereby permitting formation of a cold plasma on the other side of said structure; and means for permitting gas flow within said chamber and through said containment structure which includes openings through said structure which reduces the plasma intensity and the deposition rate of contaminants on said structure and wherein said means for containing a plasma comprises conductive surfaces oriented in a direction less than or substantially equal to 90° from the direction of the electric field.

16. The plasma reactor of claim 15 wherein said plasma has a plasma sheath and two dimensions of said openings parallel to a surface of said containment structure are greater than said plasma sheath.

17. The plasma reactor of claim 16 wherein said conductive surfaces form said openings.

18. The plasma reactor of claim 17 wherein said reactor chamber contains an anode and a cathode.

19. The plasma reactor of claim 18 wherein said reactor chamber comprises a reactive ion etching chamber.

20. The plasma reactor of claim 17 wherein said reactor chamber comprises a plasma enhanced chemical vapor deposition chamber.

21. The plasma reactor of claim 17 wherein the openings in the upper portion of the structure are wider than the openings in the lower portion of the structure.

22. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said upper portion of the structure facing the plasma having wide openings there through for permitting gas flow within said chamber and reducing the plasma intensity, said openings on the lower portion being smaller than the upper portion.

23. The containment structure of claim 22 wherein said upper portion of the structure comprises widely spaced, conductive surfaces.

24. The containment structure of claim 23 wherein said structure further contains struts connecting said conductive surfaces.

25. The containment structure of claim 24 wherein said structure has a surface facing toward said plasma and wherein said struts are placed away from said surface.

26. The containment structure of claim 25 wherein said openings have surrounding walls, and wherein said walls are oriented in a direction less than or substantially equal to 90° from the direction of the electromagnetic field at said opening.

27. The containment structure of claim 26 wherein said openings are annular.

28. The containment structure of claim 27 wherein said structure has an insulating coating there over.

29. The containment structure of claim 22 wherein said structure has a surface facing said plasma and said openings have surrounding walls, and wherein the angle between said top surface and a portion of said walls is less than or substantially equal 90°.

30. The containment structure of claim 22 wherein said openings of the upper portion collects deposits of contaminants having minimal effect on the conductivity of the gas.

31. The containment structure of claim 30 wherein said openings contain non-overlapping conductive surfaces oriented to prevent line of sight transmission of a vector in the direction of the electromagnetic field at said opening to attenuate an electromagnetic field.

32. The containment structure of claim 22 wherein said openings have a width and a depth, and wherein the ratio of the width to depth of the openings varies across the structure as a function of strength of said electromagnetic field.

* * * * *